United States Patent
Kohler et al.

(10) Patent No.: US 7,035,964 B1
(45) Date of Patent: Apr. 25, 2006

(54) METHOD AND DEVICE FOR SECURING DATA WHEN ALTERING THE STORAGE CONTENTS OF CONTROL UNITS

(75) Inventors: Rolf Kohler, Schwieberdingen (DE); Guenter Braun, Bietigheim (DE); Matthias Kottmann, Wendlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/527,424

(22) Filed: Mar. 17, 2000

(30) Foreign Application Priority Data

Mar. 17, 1999 (DE) ................. 199 11 794

(51) Int. Cl.
*G06F 12/00* (2006.01)
*G11C 7/00* (2006.01)

(52) U.S. Cl. .............. 711/103; 711/163; 711/156; 711/164; 365/195

(58) Field of Classification Search ........... 711/103, 711/163, 164, 165, 156; 365/195
See application file for complete search history.

(56) References Cited

U.S. PATENT DOCUMENTS

| | | | | |
|---|---|---|---|---|
| 4,271,402 A | * | 6/1981 | Kastura et al. ........... 340/459 |
| 5,523,915 A | * | 6/1996 | Kamuda ................ 365/189.01 |
| 5,592,641 A | * | 1/1997 | Fandrich et al. ............ 395/430 |
| 5,778,167 A | * | 7/1998 | Carrel et al. ................... 714/8 |
| 5,912,849 A | * | 6/1999 | Yasu et al. .................. 365/195 |
| 5,920,884 A | * | 7/1999 | Jennings, III et al. ...... 711/102 |
| 5,930,826 A | * | 7/1999 | Lee et al. .................... 711/163 |
| 5,991,197 A | * | 11/1999 | Ogura et al. ........... 365/185.11 |
| 6,000,004 A | * | 12/1999 | Fukumoto .................... 711/103 |
| 6,026,016 A | * | 2/2000 | Gafken ................... 365/185.04 |
| 6,031,757 A | * | 2/2000 | Chuang et al. ......... 365/185.04 |
| 6,055,188 A | * | 4/2000 | Takeuchi et al. ........ 365/185.22 |
| 6,108,235 A | * | 8/2000 | Honma .................. 365/185.04 |
| 6,311,322 B1 | * | 10/2001 | Ikeda et al. ................. 717/168 |
| 6,363,463 B1 | * | 3/2002 | Mattison ..................... 711/164 |
| 2001/0011318 A1 | * | 8/2001 | Dalvi et al. ................. 711/103 |

FOREIGN PATENT DOCUMENTS

| | | |
|---|---|---|
| DE | 196 19 354 | 11/1997 |
| DE | 196 23 145 | 12/1997 |
| EP | 0 664 387 | 7/1995 |
| JP | 09-161493 | 6/1997 |

\* cited by examiner

*Primary Examiner*—Kimberly McLean-Mayo
(74) *Attorney, Agent, or Firm*—Kenyon & Kenyon LLP

(57) ABSTRACT

Methods of securing the erasing and/or programming or reprogramming of data and/or programs in a memory of a computer, in particular a control unit in a motor vehicle, are described. In programming, either an identifier that identifies correct erasing and/or programming of memory is entered into an area of memory that is to be erased and/or programmed or it is selected from the data and/or programs already entered, in particular from a program identifier in the form of a section from it. In addition, the identifier is altered in memory before erasing and/or programming the data and/or programs, in particular by erasing and/or programming, so that the respective memory contents are not used in the event of an interruption in the programming operation and thus in the event of defective programming.

35 Claims, 4 Drawing Sheets

METHOD AND DEVICE FOR SECURING DATA WHEN ALTERING THE STORAGE CONTENTS OF CONTROL UNITS

FIELD OF THE INVENTION

The present invention relates to a method and an associated device for programming data in a memory of a computer, where data and/or programs in a computer memory, in particular a control unit in a motor vehicle, are altered. In programming, an identifier that identifies correct erasing and/or programming of the memory is entered into the memory.

BACKGROUND INFORMATION

German Patent Application No. 196 19 354 describes a method of operating a control unit having a control function and having a programmable memory device for storing control function programs and control function data required to execute the control function. The method described here is characterized in that certain automatic control data not belonging to control function programs and control function data is entered into the memory device at predetermined locations within the memory device in conjunction with entering the control function programs and control function data. Depending on whether the certain automatic control data is stored at the predetermined locations, the control unit is then operated. Since the automatic control data in the aforementioned document is not part of the control function programs and control function data actually to be stored, i.e., the useful data, but instead is provided as a separate bit pattern, it requires additional memory. A review of the automatic control data then prevents an attempt to execute useful data that is not properly accessible or is not stored in the memory device. The cause and/or the time of occurrence of the useful data that is not accessible or is not stored is not recorded. The proposed method is also used only with memory devices or parts thereof that must be erased completely before programming. No means is provided for simply reprogramming the data, i.e., writing over the data. The goal here is to perform a type of emergency control program despite programming that is defective in part, using only the functional data to do so.

In addition, German Patent Application No. 196 23 145 describes a method of operating a control unit having a memory device programmable by a programming device, where the contents of the memory device are erased and written over each time, executing a section of the program for data processing and using data. The method described here is characterized in that at least either the program section for data processing or the data is made available so that it requires modification before being used to erase or write over old data. This modification is carried out only when it has been found that a jump in the program section for data processing has taken place or will or can take place as intended. Since the data to be entered instead of the data already entered is modified, a malfunction or a function failure due to an interruption or disturbance in the programming is unavoidable. This is all the more so since the interruption or disturbance is not noted in the memory. The modification in the above-mentioned document is used to simply and reliably prevent unintentional erasing and/or overwriting of data stored in a programmable memory device. However, this does not make it possible to secure the programming when this has already been initiated, i.e., the modification has already been carried out. Any malfunction or interruption occurring then results in data loss, i.e., incomplete programming and thus functioning of the control unit fails or becomes defective.

For these reasons, among others, it has been found that these methods are incapable of yielding optimum results in all regards.

SUMMARY OF THE INVENTION

The method and the respective device serve to secure the functionality of a control unit, for example, when an interruption or malfunction has occurred during erasing and/or programming. To do so, when an interruption or a reset occurs during erasing or programming or when the device otherwise becomes de-energized, this is noted in a memory device, in particular in the memory device to be programmed. In addition, in programming, an identifier that identifies correct erasing and/or programming of the memory is entered into an area of the memory that is to be erased and/or programmed later, in particular an area that is to be erased and/or programmed last, and this identifier is altered before erasing or programming the data or programs in such a way that the program is not executed if programming is incomplete and/or the data is not used if data entry is not complete. Thus, an error in programming or erasing can be corrected after a possible data modification.

Advantageously, the expected identifier that identifies the completeness and accuracy of the programming is used as part of the program, in particular as part of the program identifier itself, and consequently does not take up any additional memory.

Explicit deletion of data and/or programs before the erasing and/or programming that are part of the programming operation may be omitted to advantage because simply making the identifier unidentifiable is sufficient to prevent processing of the memory contents, and thus the memory contents need not be erased. Therefore, a memory that can be reprogrammed easily and quickly without first erasing it completely may also be used here.

It is also advantageous that the time and the cause of the malfunction can be stored with a flag, for example, in a memory because in a special embodiment, an application, in particular a control cannot be executed with an emergency control program but instead only a memory or its data and/or programs that have been correctly entered as intended can be read out or used for control. Therefore, the identifier may be checked and the flag may also be analyzed.

DETAILED DESCRIPTION

Figure 1:
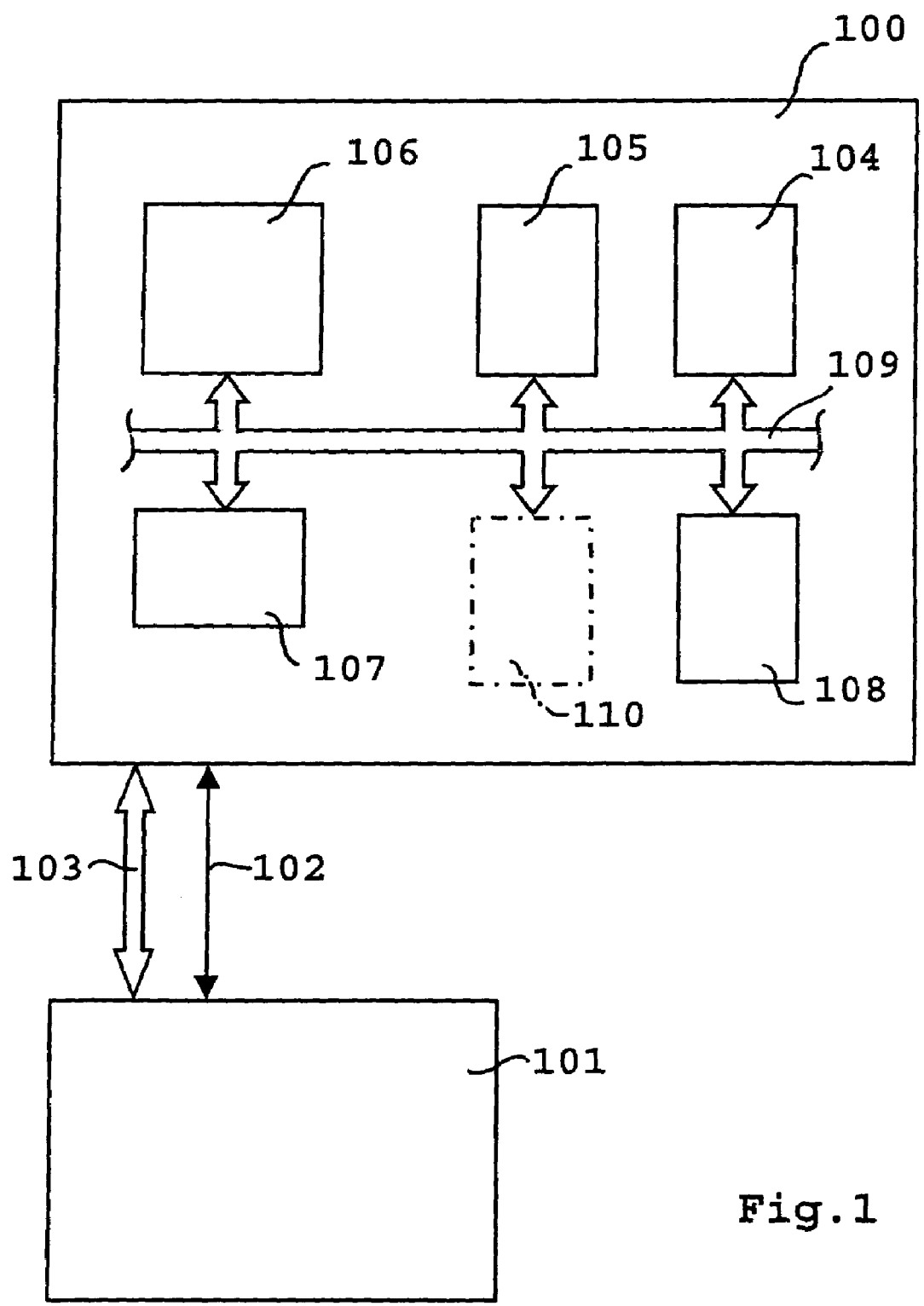
FIG. 1 shows a control unit having an internal structure and an optional external programming unit.

FIG. 1 shows as an example a hardware arrangement for implementing the method presented here. It shows a computer system 100, in particular a control unit. The internal design of control unit 100 may vary greatly. To illustrate the idea essential to the present invention, a structure having a microprocessor 106 is selected by way of an example. This microprocessor or computer unit 106 is connected to additional elements by a line system 109, in particular a bus system. The computer unit or microprocessor 106 may be equipped with its own memory, coprocessor, etc. Depending on the scope of the components and their function, i.e., depending on the components used and their application, the terms microprocessor chip (central processing unit), microprocessor, microcontroller, microcomputer, control unit (electronic control unit), computer unit, etc. may be used interchangeably for element 106. Various memory devices 104, 105 and 108 may be present in the control unit. A volatile memory 105, e.g., in the form of RAM may be used, among other things, as buffer storage of data and/or programs. Program routines may also be started from RAM 105. Memory 104 is an erasable nonvolatile memory, e.g., a flash EPROM memory. A plurality of flash EPROMs which differ greatly with regard to erasing and/or programming may be used here. For example, a first type of flash EPROM 104 must be erased completely before reprogramming. A second type of flash EPROM 104 may be erased and/or programmed in blocks, for example. A third type of flash EPROM 104 may be programmed by pages, for example but no explicit erasing is necessary. In addition to nonvolatile memory 104, another nonvolatile memory 108 may also be provided. It is possible to use a nonerasable read-only memory ROM, and an erasable nonvolatile memory in the form of an EPROM, in particular another flash EPROM may also be used. It should be pointed out here again that any arrangement and use of the memory building blocks are possible, and the number of memory building blocks may also be reduced or increased. Only one programmable and/or erasable nonvolatile or refreshable memory, shown here in the form of element 104, is necessary to illustrate the present invention.

Block 107 represents possible peripheral components, i.e., interface elements for connecting external peripherals. Additional elements and subassemblies represented, for example, by element 110, e.g., in the form of additional peripheral assemblies, memory elements, microprocessors or microcontrollers may optionally be connected to bus system 109. Programming may in turn be performed by insertion of a data carrier in control unit 100 itself or by using data from internal memories such as nonerasable nonvolatile memory 108. In addition to this internal type of programming, however, an external programming unit 101, e.g., a second control unit or computer may also be provided for programming and entering data either serially over interface 102 or as a parallel connection over a possible bus system 103. With internal programming, a set of user programs and/or data may be loaded from a data memory described above such as memory 108 in the form of ROM into volatile memory 105 and/or into erasable nonvolatile memory 104 and optionally executed there. Likewise, the programs and/or data may be entered with the help of data carriers into a peripheral element such as a reader for data carriers such as a diskette drive or a CD-ROM drive that can be connected to a possible peripheral module 107. The same possibilities are of course also available for external programming unit 101.

Figure 2:
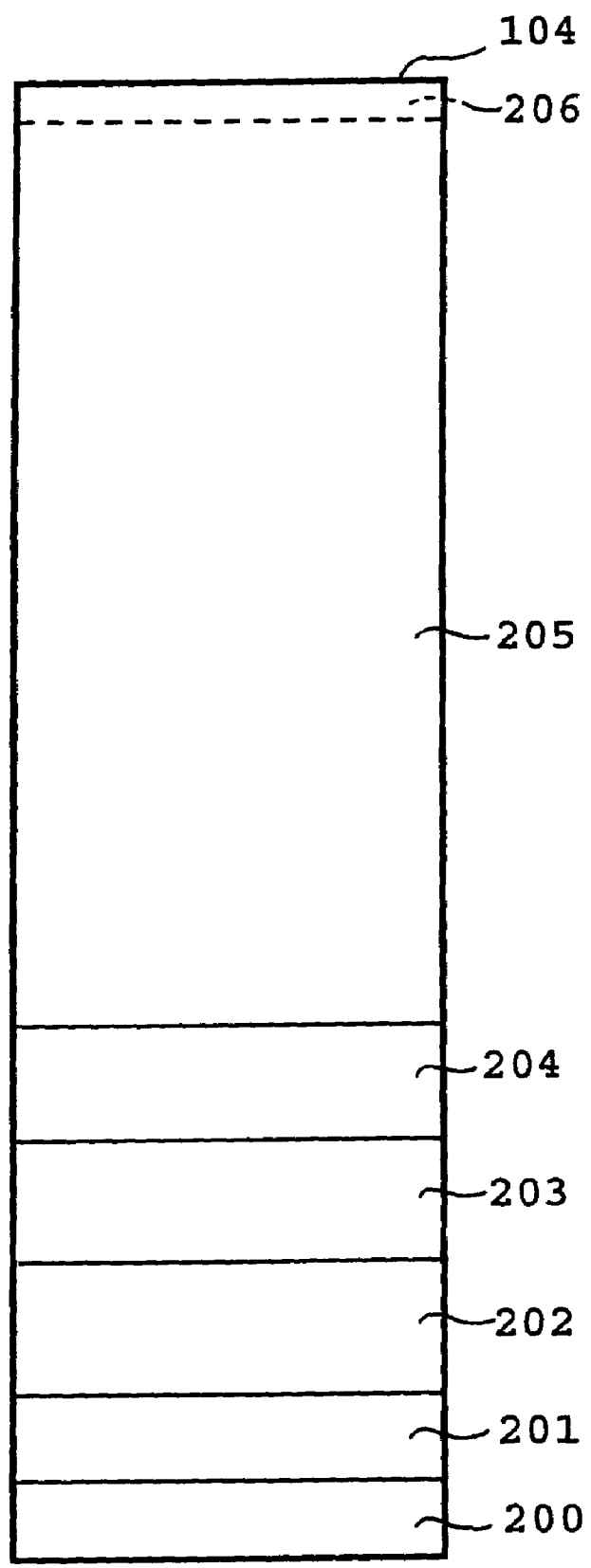
FIG. 2 shows how a nonvolatile memory that can be used here may be divided into memory areas.

FIG. 2 shows again in detail the erasable or programmable nonvolatile memory 104. It is divided into various areas 200 to 205, for example. In addition, there is a cell or a memory section 206 in memory area 205. The diagram of the memory allocation illustrated here serves only for the purpose of illustration because a number of different means of memory allocation are conceivable. One possible allocation of the areas is explained below. For example, areas 200–203 may contain vector tables and data, area 204 may contain a programming routine and area 205 may contain at least one application program. With internal programming, boot vectors with jumps to other memory areas of this memory or other memories may also be located in memory area 200, for example. For example, certain switching functions are embedded in area 201, enabling input and output coordination of the memory with microprocessor 106, for example. Area 202, for example, contains a start routine through which the remaining course is determined, depending on whether an application is to be run or programming is to take place. Area 203 is optional and may contain additional data and/or routines. For example, a program routine loaded by the startup program in area 202 into ROM 105, for example, where it controls the remaining programming operation is stored in memory area 204. The division into memory areas as proposed in FIG. 2 is optional because when using an external programming device 101, for example, some of areas 200–205 may be omitted. Programming of nonvolatile memory 104 usually takes place from the lower memory area to the upper, area 206 being programmed last.

Figure 3:
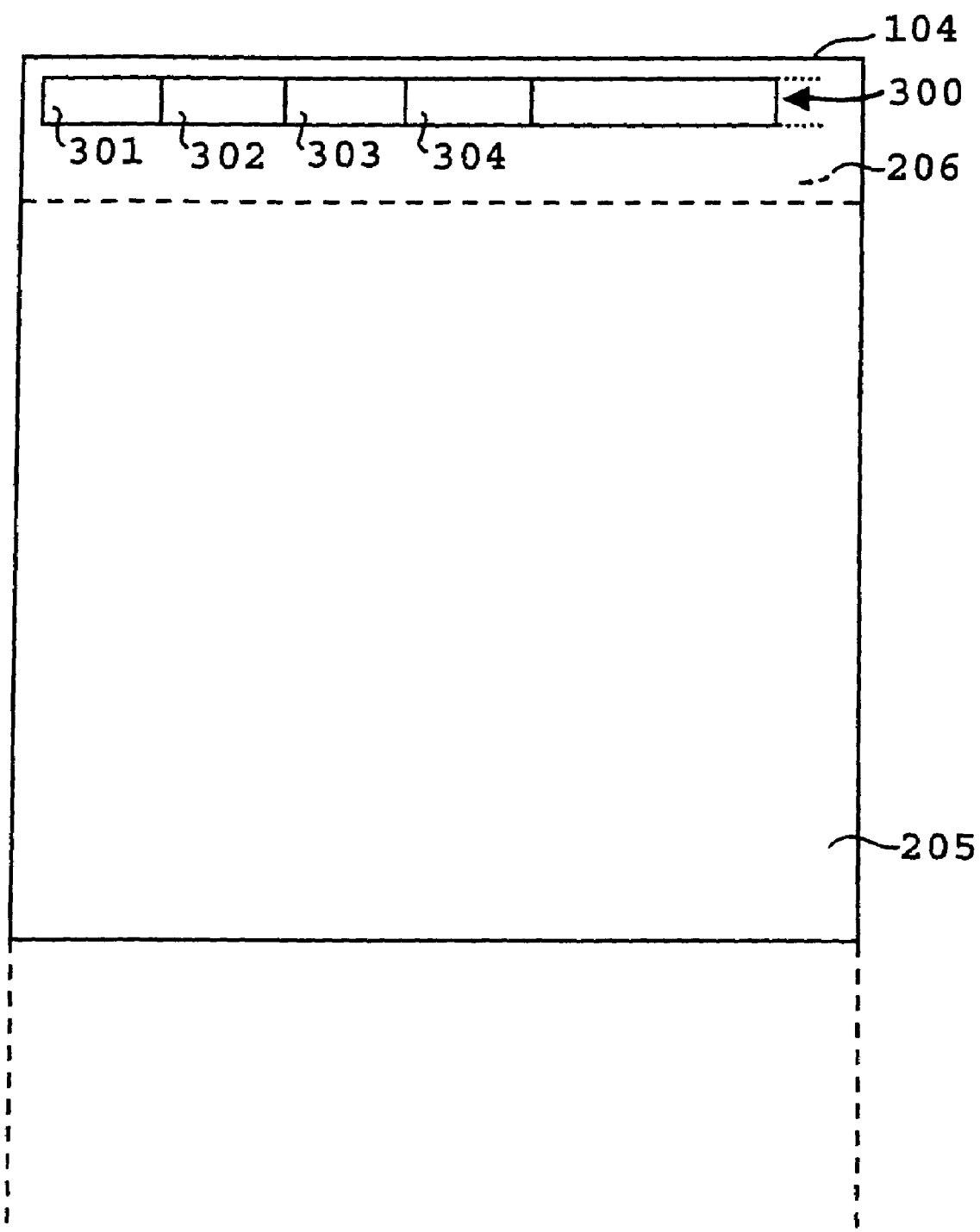
FIG. 3 shows schematically a selection of an identifier from a data section or a program section, in particular from a program identifier.

FIG. 3 shows a data and/or program section, in particular a program identifier 300 in memory 104. Program identifier 300 is located, for example, in memory area 206 of program memory area 205, because this is programmed late in the sequence of the programming operation, preferably being programmed last. This program identifier 300 may be subdivided into various subsections 301–304. Such a subsection 301–304 may include, for example, a predetermined number of bit positions or a column of a predetermined length of letters and numbers or any characters. Before or during the programming operation, at least one subsection, e.g., subsection 301, is selected as identifier K and stored for later checking. However, with data and/or programs that are already known or with repeating programming operations, a certain identifier may be specified in the form of a subsection. In addition, however, identifier K may also be composed of various data sections and/or program sections or the subsections contained therein. These subsections, which may then be combined to form identifier K, may be selected at very different positions in the data and/or programs.

In a preferred embodiment, a data and/or program section that is easy to recover such as program identifier 300 is selected as the basis for identifier K, so the subsection(s) functioning as the identifier can also be recovered easily. Its precise position should also be known even after modification to permit checking of identifier K.

Subsection 301, which was selected as identifier K, for example, may include any six characters, for example. This identifier K, e.g., G47F03, i.e., subsection 301 of program identifier 300, may be selected on the basis of the fact that it is especially unmistakable, i.e., unambiguous. Then the precise position of this subsection in the data and/or programs need not be known precisely. However, if the position of identifier K is known precisely as first subsection 301 of program identifier 300 and if the number of characters or bits is known precisely because it is predetermined, then it is possible to use an identifier K which occurs more frequently in the data and/or programs already programmed or to be programmed. The transition in these selection conditions is fluid. It may be especially advantageous to preselect the last subsection to be programmed as identifier K.

Figure 4:
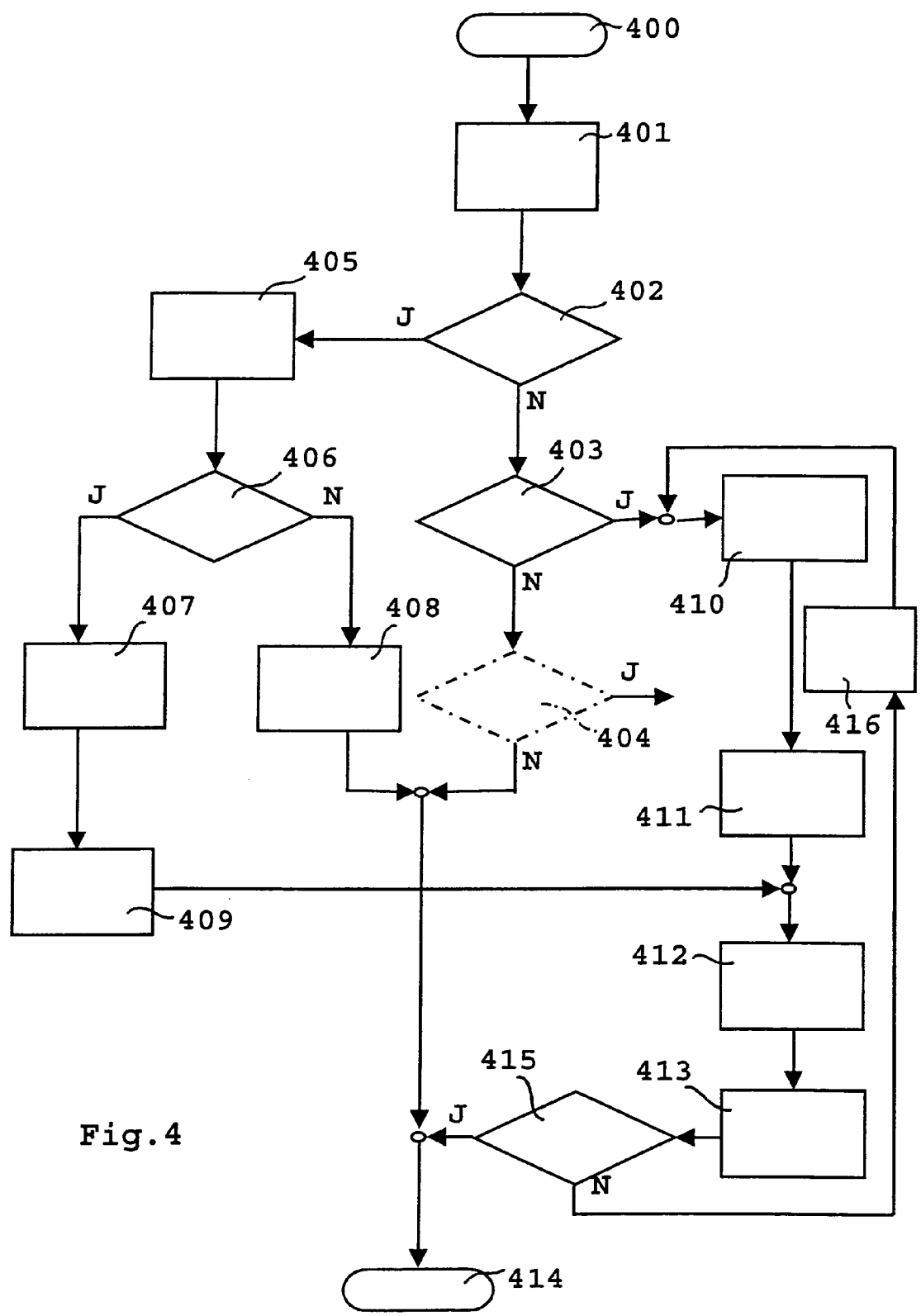
FIG. 4 shows a flow chart for a method according to the present invention.

FIG. 4 shows a flow chart of how programming with safeguarding of a memory is performed as in the case of nonvolatile memory 104, for example, from a current program for operation of the control unit, in particular from a driving program with a control unit for controlling operating sequences of a motor vehicle. This means that when the control unit is turned on, the programming session is started, e.g., by software protocol, and the operating system is automatically changed and then programmed.

The securing effect is achieved by the fact that before erasing or programming the entire memory or a block or a page, depending on the type of flash EPROM used, an identifier at the end of the last existing block or the last page or the last cell of the entire memory, said identifier having been entered previously, which identifies correct erasing and/or programming of the memory, is rendered invalid by a change, e.g., by being erased or reprogrammed, in particular it is rendered unidentifiable, e.g., for a comparison query or a search query. Such an identifier K may be, for example, a code of multiple letters and numbers which is erased or written over with zeros, for example. To do so, an existing part of the data and/or programs of the program identifier is used, for example. Therefore, this identifier K need not be programmed separately. Only when the entire programming operation or the erase and reprogramming operation is concluded and identifier K has been entered again is the program valid again. If there is any interruption, a reset, or if the device otherwise becomes de-energized during erasing and/or programming, the altered identifier K is not entered again and thus the program is not valid and cannot be executed. In addition, however, this interruption is noted in the flash EPROM itself that is used, because identifier K is invalid, leading to the result that in a restart it is necessary to first inquire whether the existing program is capable of running. If identifier K is invalid and thus the program is incapable of running, the operating system may automatically be called up for programming, in particular the boot block, in a nonvolatile nonerasable memory such as memory 108 in the form of a ROM or in a nonerasable part of flash EPROM memory 104 itself, and then the system waits for reprogramming. Thus, an incompletely or incorrectly programmed flash EPROM 104 is not an obstacle that would prevent reprogramming.

The operation starts in block 400 in FIG. 4. The program to be processed is determined first in block 401. This selection can be made from a number of different programs and program routines. With respect to a control unit in a motor vehicle, these may be, for example, different driving programs, at least one boot program, etc. This determination can be made by preselecting a program identifier 300 or by selecting a flag having one or more bit positions. This preselection is then checked in queries 402, 403 and 404. Query 404 symbolically represents the transition to optionally additional programs. By adding additional queries such as 404 and thus possible additional branches, a plurality of programs, in particular driving programs, as well as boot programs or program routines may thus be represented. Then in a preferred embodiment, identifier K and/or the respective subsection(s) may also be specified in block 401. Identifier K may thus be specified for all programming operations, e.g., preselected with repeating programming operations or per each programming operation and thus it may be variable on the whole. In block 402 a query is then issued to determine whether driving program 1 has been selected by the program identification or the selection of flags. If this is the case, the system returns to block 405. Then a reset is triggered in block 405, performing the necessary initialization for driving program 1 and establishing the communication connection. If it is found in query 402 that driving program 1 has not been selected, then a check is made in query 403, for example, to determine whether there is a programming request. To do so, a query is issued at branching point 403 to determine whether the boot block or the boot program has been selected as a possible sign of subsequent programming. If this is not the case, additional queries, with query 404 being shown as optionally representative, may check on which additional possible program has been selected. If none of the programs available has been selected, one goes to the end of the process in block 414. Otherwise, it is possible to jump to additional programs starting from query 404 which is shown as representative for other branches.

However, if a boot program, e.g., boot program 1 is selected in query 403, this leads to block 410 where there is also a reset to the beginning (reset) and initialization depending on boot program 1 and establishment of communication. In block 411, the session of the programming mode of the programming device is then started. Next in block 412 identifier K is altered, in particular rendered unidentifiable as part of the program, in particular as part of program identifier 300 to advantage. Before the change in identifier K, this and a possible flag for interruption of the programming operation may be analyzed. Likewise, identifier K may be selected or predetermined here immediately before the change in identifier K by control unit 100 or a programming unit 101. For rapid erasing or programming, a change in baud rate can be implemented in block 412, switching from a lower normal communication bit rate to a higher erase and/or programming bit rate. Then the actual erasing or programming operation takes place in block 413, erasing by pages, blocks, globally or by cells and/or reprogramming, as mentioned above, depending on the memory used. At the end of the programming operation in block 413 and/or after an interruption, e.g., due to a disturbance, a reset and/or a de-energized state of control unit 100 or microprocessor 106 of the programming operation, the correctness of identifier K is checked in block 415. If identifier K is not recognized as correct, there is a renewed entry into the interrupted boot program. It is possible in a block 416 to provide for a flag noting the cause and the time of the interruption, for example, to be entered into a memory, in particular the memory to be programmed. However, if identifier K is identified as correct, this leads to block 414, the end of the process. This means that even after complete programming without an interruption, identifier K and/or any flag that might be present can be checked. Since identifier K is entered into an area that is programmed as late as possible, preferably last, such as memory area 206 of programming area 205 in FIG. 2, a correct identifier K is available again only when the programming operation has been finished completely and correctly.

For security reasons, identifier K and optionally the flag for an interruption may also be checked and analyzed in principle at the start of an application program, in particular a driving program for a motor vehicle and optionally also at the beginning of a programming routine or a boot program, i.e., in queries 402, 403, 404 . . . Then it is advantageously possible to enter into an application program only if the correct program has been selected and in addition identifier K and/or the flag for an interruption has been checked and recognized as correct. If jumping to a boot program, e.g., a programming routine, i.e., if programming is to occur anyway, there is at least an indication if identifier K is not correct or there is a flag. If the memory programming is to be secured and performed cell by cell, page by page or block by block, it is also possible to determine whether the identifier is correct and/or whether there is a flag with all the parts of the data and/or programs not to be programmed.

Before the start of an erasing or programming operation, i.e., in block 412 in this example, this identifier K is altered, in particular it is rendered unidentifiable. The expected identifier K is advantageously part of the program itself. If no boot program is selected in block 401 but instead a driving program, for example, is selected, i.e., an application program, this is recognized in queries 402, 403, 404 and optionally following queries. In the case of driving program 1, query 402 then leads to block 405 where the above-mentioned operations are carried out. Then following the functions of processing in the application program, for example, query 406 determines whether or not a programming session is to be started. If this is not the case, it goes to block 408 where the selected program which is already in a memory, in particular nonvolatile memory 104, is processed, arriving at the end at block 414 again, the end of the process. However, if query 406 reveals that the operator wishes to perform programming within the application program, in particular driving program 1, this leads to block 407. Depending on certain conditions, the programming mode session is then started in block 407. These conditions include, for example, the engine not running, e.g., in conjunction with a default mode, consent that the syntax is in order, in particular when a baud rate switch is requested, etc. These conditions can also be queried in block 411. Depending on maintenance of the conditions, different error messages are issued in detail. If these conditions for the programming mode are met, the source and target address are saved in another memory or memory area and a software reset is initiated. At this point a code may also be set, indicating that programming of the nonvolatile memory, in particular flash memory 104, is to be performed. If a software reset occurs then, initialization is performed after the reset and the code entered for flash programming is checked. If this code is correct, it may also be altered in a controlled manner, for example, in order to be identified again later on the basis of this action. This may be accomplished, for example, by shifting the code to the right by one bit. However, other measures are also conceivable.

Next, there is a function call for establishing communication in block 409. Then the communication regarding the boot program is established in block 409. To do so, this must not already be present and the code that has been altered in a controlled manner must be recognized. Then initialization takes place in block 409 as it does at the start of communication in the boot program or in the boot block in block 410. The interface is likewise initialized at a normal communication transfer rate, the transmission is set, communication is activated, etc. Likewise, when communication is established, a flag, for example, is set for the baud rate switch, so that immediately after sending a positive response in the course of communication, the transmission rate or baud rate in block 412 can be switched again. Likewise, the programming mode session is activated here. After a positive response in the wake of the communication connection, this is entered into a buffer and the transmission process begins. Then the system goes to block 412 and the remaining course in the boot program begins again with a baud rate change.

What is claimed is:

1. A method of programming information in a memory arrangement of a computer, comprising the steps of:
    providing an identifier written into an area of the memory arrangement that is to be programmed, wherein the identifier enables identification of a correct programming of the memory arrangement;
    rendering the identifier unrecognizable by altering the identifier in the memory arrangement before programming the information; and
    rendering the identifier recognizable upon correct programming of the area of the memory arrangement, whereby the identifier is able to be detected only after the correct programming is concluded, wherein programmed information in the area of the memory arrangement is executed only if the identifier is recognized as being correct after the programming.

2. The method according to claim 1, wherein the computer is a control unit in a motor vehicle.

3. The method according to claim 1, wherein the altering step includes the substep of:
    altering the identifier by at least one of erasing and programming.

4. The method according to claim 1, wherein the identifier is located in a section that is programmed last in the area of the memory arrangement programmed.

5. The method according to claim 1, wherein the identifier is a component of the information.

6. The method according to claim 4, wherein the identifier is altered by at least one of erasing and programming so that the identifier is unidentifiable.

7. The method according to claim 1, wherein the identifier is a section of a program identifier which identifies the respective information.

8. The method according to claim 1, further comprising the step of:
    checking the identifier after at least one of (a) an interruption in programming and (b) programming the memory arrangement.

9. The method according to claim 8, further comprising the step of:
    storing the interruption with a flag in the memory arrangement.

10. The method according to claim 9, further comprising the steps of:
    checking at least one of the identifier and the flag before programming; and
    analyzing at least one of the identifier and the flag before programming.

11. The method of claim 1 wherein the information includes data.

12. The method of claim 1 wherein the information includes programs.

13. A method of reprogramming information in a memory arrangement of a computer, comprising the step of:
    selecting an identifier from the information entered into an area of the memory to be reprogrammed, wherein the identifier enables identification of a correct reprogramming of the memory arrangement;
    rendering the identifier unrecognizable by altering the identifier in the memory arrangement before reprogramming the information; and
    rendering the identifier recognizable upon correct reprogramming of the area of the memory arrangement, whereby the identifier is able to be detected only after the correct reprogramming is concluded, wherein reprogrammed information in the area of the memory arrangement is executed only if the identifier is recognized as being correct after the reprogramming.

14. The method according to claim 13, wherein the computer is a control unit in a motor vehicle.

15. The method according to claim 13, wherein the identifier is located in a section that is reprogrammed last in the area of the memory arrangement.

16. The method according to claim 15, wherein the altering step includes the substep of:
   altering the selected identifier by at least one of erasing and programming.

17. The method according to claim 13, wherein the identifier is at least one section of a predetermined length of the information entered into the memory arrangement.

18. The method according to claim 13, wherein the identifier is altered by at least one of erasing and programming so that the identifier is unidentifiable.

19. The method according to claim 13, wherein the identifier is a section of a program identifier which identifies the information.

20. The method according to claim 13, further comprising the step of:
   checking the identifier after at least one of (a) an interruption in reprogramming and (b) reprogramming the memory arrangement.

21. The method according to claim 20, further comprising the step of:
   storing the interruption with a flag in the memory arrangement.

22. The method according to claim 21, further comprising the steps of:
   checking at least one of the identifier and the flag before reprogramming; and
   analyzing at least one of the identifier and the flag before reprogramming.

23. The method of claim 13 wherein the information includes data.

24. The method of claim 13 wherein the information includes programs.

25. A device for programming information in a memory arrangement of a computer, comprising:
   a programming arrangement entering an identifier into an area of the memory arrangement to be programmed, wherein the identifier enables identification of a correct programming of the memory arrangement, the programming arrangement rendering the identifier unrecognizable by altering the identifier in the memory arrangement before programming the information, and the programming arrangement rendering the identifier recognizable upon correct programming of the area of the memory arrangement, whereby the identifier is able to be detected only after the correct programming is concluded, wherein programmed information in the area of the memory arrangement is executed only if the identifier is recognized as being correct after the programming.

26. The device according to claim 25, wherein the computer is a control unit in a motor vehicle.

27. The device according to claim 25, wherein the identifier is altered by at least one of erasing and programming.

28. A device, comprising:
   a reprogramming arrangement reprogramming information in a memory arrangement of a computer, the reprogramming arrangement selecting an identifier from the information entered into an area of the memory arrangement to be reprogrammed, wherein the identifier enables identification of a correct reprogramming of the memory arrangement, the reprogramming arrangement rendering the identifier unrecognizable by altering the identifier in the memory arrangement before reprogramming the information, and the reprogramming arrangement rendering the identifier recognizable upon correct reprogramming of the area of the memory arrangement, whereby the identifier is able to be detected only after the correct reprogramming is concluded, wherein reprogrammed information in the area of the memory arrangement is executed only if the identifier is recognized as being correct after the reprogramming.

29. The device according to claim 28, wherein the computer is a control unit in a motor vehicle.

30. A method of erasing information in a memory arrangement of a computer, comprising:
   providing an identifier written into an area of the memory arrangement that is to be at least partially erased, wherein the identifier enables identification of a correct erasing of the memory arrangement;
   rendering the identifier unrecognizable by altering the identifier in the memory arrangement before erasing the information; and
   rendering the identifier recognizable upon correct erasing of the area of the memory arrangement, whereby the identifier is able to be detected only after the correct erasing is concluded, wherein remaining information in the memory arrangement is executed only if the identifier is recognized as being correct after the erasing.

31. A device for erasing information in a memory arrangement of a computer, comprising:
   a programming arrangement entering an identifier into an area of the memory arrangement to be at least partially erased, wherein the identifier enables identification of a correct erasing of the memory arrangement, the programming arrangement rendering the identifier unrecognizable by altering the identifier in the memory arrangement before erasing the information, and the programming arrangement rendering the identifier recognizable upon correct erasing of the area of the memory arrangement, whereby the identifier is able to be detected only after the correct erasing is concluded, wherein remaining information in the memory arrangement is executed only if the identifier is recognized as being correct after the erasing.

32. A method of erasing and programming information in a memory arrangement of a computer, comprising:
   providing an identifier written into an area of the memory arrangement that is to be erased and programmed, wherein the identifier enables identification of a correct erasing and programming of the memory arrangement;
   rendering the identifier unrecognizable by altering the identifier in the memory arrangement before erasing and programming the information; and
   rendering the identifier recognizable upon correct erasing and programming of the area of the memory arrangement, whereby the identifier is able to be detected only after the correct erasing and programming is concluded, wherein programmed information in the area of the memory arrangement is executed only if the identifier is recognized as being correct after the erasing and programming.

33. A method of reprogramming information in a memory arrangement of a computer, comprising:
   selecting an identifier from the information entered into an area of the memory to be reprogrammed, wherein the identifier enables identification of a correct erasing and reprogramming of the memory arrangement;
   rendering the identifier unrecognizable by altering the identifier in the memory arrangement before erasing and reprogramming of the area of the memory arrangement; and rendering the identifier recognizable upon correct erasing and reprogramming of the area of the memory arrangement, whereby the identifier is able to be detected only after the correct erasing and reprogramming is concluded, wherein reprogrammed information in the area of the memory arrangement is executed only if the identifier is recognized as being correct after the erasing and reprogramming.

34. A device for erasing and programming information in a memory arrangement of a computer, comprising:
a programming arrangement entering an identifier into an area of the memory arrangement be erased and programmed, wherein the identifier enables identification of a correct erasing and programming of the memory arrangement, the programming arrangement rendering the identifier unrecognizable by altering the identifier in the memory arrangement before erasing and programming the information and the programming arrangement rendering the identifier recognizable upon correct erasing and programming of the area of the memory arrangement, whereby the identifier is able to be detected only after the correct erasing and programming is concluded, wherein programmed information in the area of the memory arrangement is executed only if the identifier is recognized as being correct after the erasing and programming.

35. A device for reprogramming information, comprising:
an arrangement for reprogramming information in a memory arrangement of a computer, the reprogramming arrangement selecting an identifier from the information entered into an area of the memory arrangement to be erased and reprogrammed, wherein the identifier enables identification of a correct erasing and reprogramming of the memory arrangement, the reprogramming arrangement rendering the identifier unrecognizable by altering the identifier in the memory arrangement before erasing and reprogramming the memory arrangement, and the reprogramming arrangement rendering the identifier recognizable upon correct erasing and reprogramming of the area of the memory arrangement, whereby the identifier is able to be detected only after the correct erasing and reprogramming is concluded, wherein reprogrammed information in the area of the memory arrangement is executed only if the identifier is recognized as being correct after the erasing and reprogramming.

* * * * *